United States Patent [19]

Guery

[11] Patent Number: 4,797,632

[45] Date of Patent: Jan. 10, 1989

[54] VARIABLE GAIN AMPLIFIER CIRCUIT AND ITS USE IN AN AUTOMATIC GAIN CONTROL ARRANGEMENT

[75] Inventor: Alain Guery, Paris, France

[73] Assignee: U.S. Philips Corporation, New York, N.Y.

[21] Appl. No.: 112,869

[22] Filed: Oct. 23, 1987

[30] Foreign Application Priority Data

Nov. 18, 1986 [FR] France ............................. 8615994

[51] Int. Cl.$^4$ .............................................. H03G 3/30
[52] U.S. Cl. .................................... 330/285; 330/277; 330/260
[58] Field of Search ............... 330/131, 139, 138, 279, 330/254, 277, 280, 285, 290, 278; 455/234, 235, 253

[56] References Cited

U.S. PATENT DOCUMENTS 3,469,195  9/1969  Harwood ......................... 330/278 X
4,590,613  5/1986  Tannery .......................... 330/285 X Primary Examiner—James B. Mullins
Attorney, Agent, or Firm—Marianne R. Rich

[57] ABSTRACT

An amplifier circuit whose input stage (1) has a variable gain and a DC voltage level on its load resistor (Rc), which is stabilized with the aid of means comprising a DC current generator (S), which varies contrary to the average output current of this input stage (1) and which for this purpose supplies a complementary current ($I_2$) on this load resistor (Rc).

The stabilizing means furthermore comprise a high gain differential amplifier (A) of which an input (15) is connected to the active terminal (11) of the load resistor (Rc) and whose output signal is used for the current generator control (S) via a low-pass filter (F) such that that complementary current ($I_2$) is applied as negative feedback to the input (15) of the differential amplifier (A). An automatic gain control device which utilizes this amplifier circuit is also shown.

7 Claims, 1 Drawing Sheet

VARIABLE GAIN AMPLIFIER CIRCUIT AND ITS USE IN AN AUTOMATIC GAIN CONTROL ARRANGEMENT

BACKGROUND OF THE INVENTION

1. Field of the Invention

The present invention relates to an amplifier circuit whose input stage comprises a gain control and whose preamplified signal output available on an active terminal of a load resistor carries a voltage the DC level of which is stabilized by associated means comprising a variable DC current generator as opposed to the average output current of the input stage and whose current is equally applied to the load resistor so that the sum of the direct currents passing through it is constant, and means which compensate for the effects of the gain control on the average operating point of the input stage.

2. Description of Related Art

The method of varying the gain of a bipolar transistor by changing the average operating point, (quiescent current) is well-known and widely used. Although it is advantageous in its simplicity, it does have the inconvenience of generating on the active terminal of the load resistor very significant DC voltage variations, which make a subsequent use of the signal very difficult, especially if one wishes to utilize a DC coupled wideband amplifier.

Thus, it has been proposed to stabilize the DC output level of the input stage by utilizing a variable DC current generator to supply a current in opposition to the average current of the amplifier transistor and also applying this current to the load resistor of the amplifier transistor so that the sum of the direct currents passing there through is constant.

An amplifier circuit of this type is known from the U.S. Pat. No. 3,678,406. It is based on the property of similarity of identical bipolar transistor characteristics and uses, more specifically, a current mirror circuit.

In so far as this similarity is not perfect, the stabilization of the DC output level of the known amplifier is not perfect and in connection herewith the subsequent signal amplification can no longer be proceeded with to a very high gain level. Furthermore, the gain variations which can be achieved are not as extensive as could be desired according to this known technique which only applies to the case in which the input stage is a bipolar transistor.

The invention has for its object to provide a variable gain amplifier circuit which does not have these inconveniences and which is not restricted to the use of a bipolar transistor for an input stage.

The invention also relates to the utilization of this circuit in an automatic gain control device.

SUMMARY OF THE INVENTION

According to the present invention, an amplifier circuit as defined in the opening paragraph is more specifically characterized in that the means for stabilizing the DC level comprises a high gain differential amplifier a first input of which is connected to the active terminal of the load resistor, and a second input is connected to a continuous reference voltage, the output of which is applied as an input to a low-pass filter which supplies on its output a signal for a current generator control in such a way that the current supplied by the generator is applied as negative feedback to the first input of the differential amplifier.

Such an amplifier circuit can be used irrespective of the type of its input stage be it a bipolar or a field effect transistor. This ensures a better stabilization of the DC output voltage according as the gain of the differential amplifier is higher.

The features of the low-pass filter can easily be determined whilst taking into account the lower limit of the transmission frequency band and the desired response time of the stabilization of the DC output level when a sudden variation is made in the gain control of the input stage.

In applications of the circuit in which the gain control varies slowly with time, (substantially static control as well as a compensation of the ageing process, for example), the low-pass filter can advantageously be reduced to a single R-C circuit having a large time constant as against the low limit of the transmission frequency band.

The amplifier circuit in accordance with the invention is particularly suitable for use in the amplification range of very weak digital signals in combination with an input stage constituted by a field effect transistor having two gates. Hence, excellent performance is obtained with respect to the very weak noise of this type of transistor and the very wide range of possible gain variation.

It should be noted that the amplified alternative signal can be taken off at any point in the amplifying chain from the active terminal of the load resistor to the output of the differential amplifier.

From a practical point of view, an optimal solution can be found in taking off the alternative and amplified portion of the signal at an intermediate stage of the differential amplifier, and amplifying this signal again, if necessary, by a separate amplifier stage of the amplifying channel leading to the low-pass filter.

The invention also relates to an automatic gain control device utilizing the amplifier circuit defined above, characterized in that an output of the differential amplifier forms an output terminal for the level-controlled amplified signal, whilst this signal is applied to the input of a series of elements arranged in cascade, comprising first a peak detector, then a comparator and finally a further low-pass filter, and the gain control of the input stage is provided by the output of the said series of elements.

BRIEF DESCRIPTION OF THE DRAWINGS

The invention will be better understood from the following detailed description with reference to the schematic diagrams in which.

DESCRIPTION OF THE PREFERRED EMBODIMENT

Figure 1:
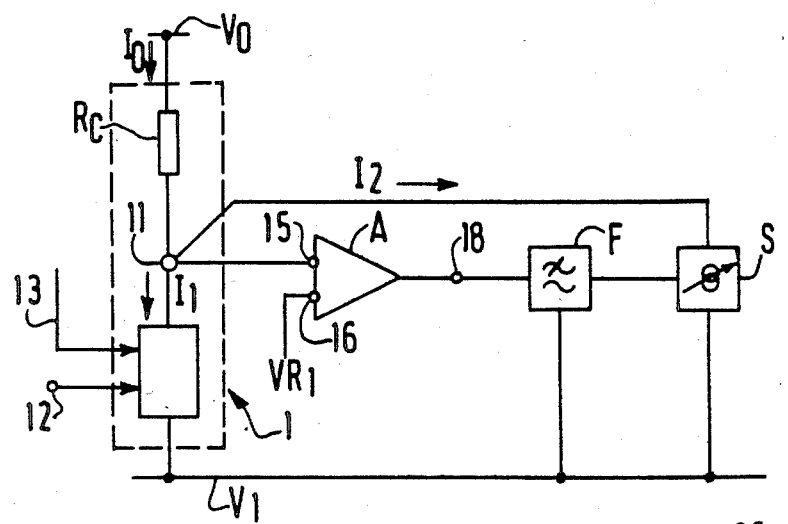
FIG. 1 shows a block diagram of the amplifier circuit according to the invention.

The amplifier circuit of FIG. 1 comprises an input stage 1 supplying a preamplified signal on an active terminal 11 of a load resistor Rc. The input stage is fed by two supply voltage terminals $V_0$ and $V_1$. The input stage 1, which can comprise one or a plurality of transistors, has a signal input terminal 12 as well as a gain control 13 capable of varying the gain of this input stage by varying the operating point of at least one transistor of this stage. The input stage 1 is of the type in which the gain control produces an accompanying variation of the average output current of this stage applied to the load resistor Rc, so that the voltage on the active terminal 11 of the load resistor Rc has a DC voltage level which is subject to large variations in the absence of any other compensating means. For effecting a stabilization of the average DC level on the active terminal 11 of the load resistor Rc a current generator S can be connected to this circuit, which generator is controlled such that its current varies oppositely to the average output current of the input stage, this current also being applied to the load resistor Rc such that the sum $I_0$ of the current $I_1$ passing through the input stage 1 and the current produced $I_2$ by the current generator S is constant.

According to the invention, the stabilizing means for the DC output level of the input stage 1 further comprise a high gain differential amplifier A, of which a first input 15 is connected to the active terminal 11 of the load resistor Rc, and a second input 16 is connected to a DC voltage reference VR1. A low-pass filter F receives on its input the output signal of the differential amplifier A and supplies at its output a signal for the control of the current generator S, input 15 or input 16 of the differential amplifier A being chosen non inverting or inverting depending on the manner in which the current supplied by the current generator S is applied as negative feedback to the first input 15 of the differential amplifier A. The voltage of the active terminal 11 of the load resistor Rc thus has a DC level which is more stabilized according as the gain of the differential amplifier A is higher. If need be, an additional amplifier could also be inserted between the low-pass filter F and the current generator S improving the degree of stability of the active terminal 11 without being impeded by the alternative amplified signal.

The current generator S can be a bipolar transistor whose collector impedance becomes large with respect to the value of the load resistor Rc, and does not disturb the amplified signal.

The cut-off frequency of the low-pass filter F is chosen whilst taking into consideration the desired response time for stabilizing the DC level of the active terminal 11 and taking into consideration the low limit of the transmission frequency range. The amplified signal can be taken off at the active terminal 11 of the load resistor Rc, also at the output terminal 18 of the differential amplifier A and also at any intermediate amplifying point within the differential amplifier A when it comprises a plurality of amplifier stages.

Figure 2:
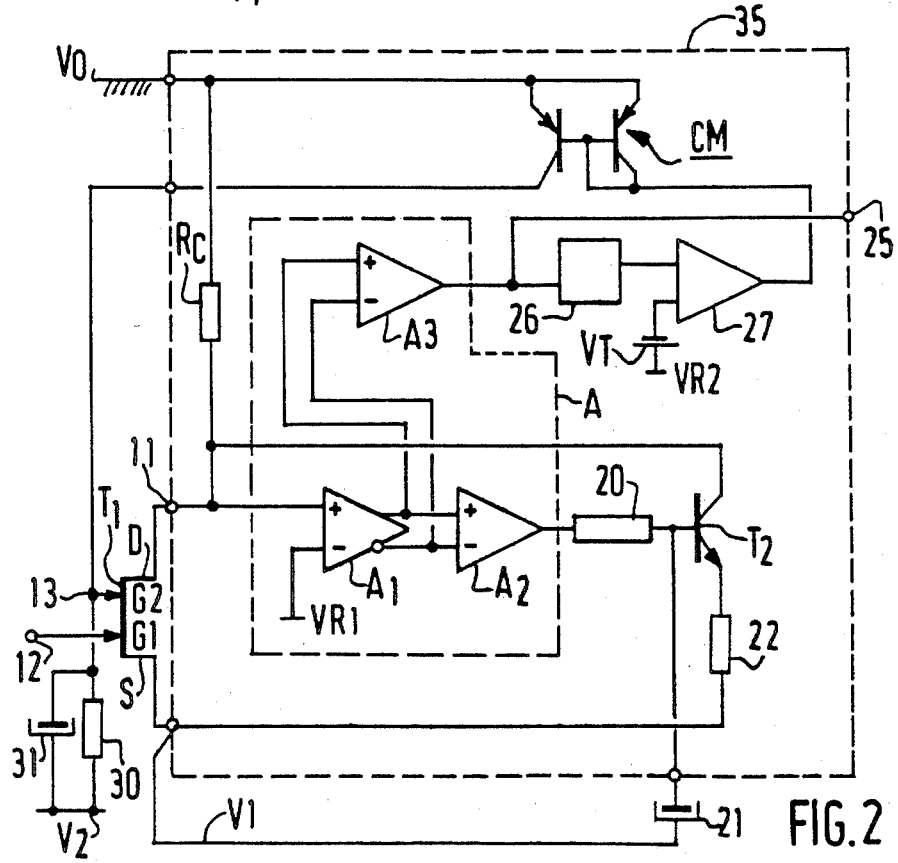
FIG. 2 shows the diagram of an automatic gain control device utilizing the amplifier circuit of FIG. 1.

FIG. 2 shows a diagram for the use of an amplifier circuit of FIG. 1 in an automatic gain control device. Reference numerals which are identical to those of FIG. 1 have been used for identical elements having the same functions.

The input stage of the amplifier circuit is constituted here by a field effect transistor $T_1$ having two gates $G_1$, $G_2$, gate $G_1$ being connected to the signal input terminal 12 and gate $G_2$ receiving gain control 13. The drain of transistor $T_1$ is connected to the supply voltage $V_0$ via load resistor Rc. As is already known, the gain of transistor $T_1$ can be varied to a large extent by exerting influence on the gate $G_2$ which causes the DC quiescent current of this transistor to vary to a large extent too. To compensate for these variations, a transistor $T_2$ is arranged in the current generator whose collector is connected to the active terminal 11 of the load resistor Rc and also to the non-inverting input of the differential amplifier A which, for reasons which are explained hereinafter, is divided into two portions, an input portion $A_1$, and an output portion $A_2$, whilst in the output portion $A_2$ the low-pass filter is in this case only constituted by a resistor 20 connected in series with the base of transistor $T_2$ and a capacitor 21 connected in parallel between the base of transistor $T_2$ and the supply voltage $V_1$. It should be noted that in general the resistor 20 can in fact be constituted by the output resistor of portion $A_2$ of the differential amplifier A. The diagram likewise shows a resistor 22 connected in series with the emitter of transistor $T_2$, which resistor improves the linearity of the circuit operation but which resistor is not strictly indispensable and depends on the features of the differential amplifier A. The differential amplifier A comprise a third portion $A_3$ whose signal input is connected to an intermediate amplifier stage between the amplifier portions $A_1$ and $A_2$ and supplies on the output terminal 25 the alternative signal amplified by the amplifier circuit.

The alternative signal has to be taken off at an intermediate amplifying stage more specifically when the resistor 20 of the low-pass filter of the R-C type is constituted by the output impedance of the amplifier portion $A_2$. The automatic gain control device is completed by a peak detector 26 connected to the output of the third differential amplifier portion $A_3$ which detector is followed by a comparator 27. The level of the signal at the output of the detector 26 which refers to a reference voltage VR2 is compared thereto, incremented by a threshold voltage VT. The output signal of the comparator 27 is a current which is proportional to the difference at the input of the comparator. This current controls a current mirror circuit CM which refers to the supply voltage $V_0$, delivering the reflected current at a bias resistor 30 further connected to a supply voltage $V_2$, which for convenience, can be different from the supply voltage $V_1$.

A capacitor 31 is connected in parallel with the bias resistor 30 and this combination constitutes a filter of the R-C type, whilst the voltage developed on this filter is applied to the gate 2 of the gain control of the transistor $T_1$. The time constant of the automatic gain control preferably has a lower value than the time constant of the closed-loop filter constituted by the resistor 20 and the capacitor 21. The gain control by means of a current mirror circuit is advantageous in that it allows a very great variation of the control voltage, together with the possibility of adjusting the supply voltage $V_2$ with respect to the supply voltage $V_1$.

In the embodiment of the invention shown in FIG. 2, the low-pass filter required for the gain control is arranged after the output of the comparator 27. However, it is clear that this filter could as well be inserted between the peak detector 26 and the comparator 27.

The device of FIG. 2 is advantageously realised to a large extent in the form of a monolithic integrated circuit, the integrated portion being shown inside the box of broken lines 35. The transistor $T_1$ is preferably a gallium arsenide field effect transistor which shows excellent characteristic features with respect to noise and cut-off frequency. For this reason it is inserted outside the integrated portion shown inside the box 35, which portion is made of silicon according to a technique related to the ECL logic. The bias resistor 30 which is shown as an external element of the integrated portion can, if so desired, in certain cases be integrated.

A device as shown in FIG. 2 is particularly suitable for amplifying digital signals so that they appear at the output of a fibre optic detector for digital communication at a rate of 140 Mbits/second.

What is claimed is:

1. An amplifier circuit comprising an input stage including an active element connected in series with a load resistor between first and second points of D.C. reference potential, said active element having a signal input terminal and a gain control adapted to be varied by varying the operating point of said active element for producing on an active terminal of said load resistor an amplified output signal which has a D.C. component which may vary in level with changes in said operating point; and means for stabilizing the level of the D.C. component of said output signal comprising
a variable D.C. current generator for generating and applying to the active terminal of said load resistor a current in opposition to the average output current of said input stage of a value such that the sum of the currents passing through said load resistor is constant,
a high-gain differential amplifier having a first input connected to said active terminal of said load resistor, a second input connected to a third point of reference potential, and an output terminal, and
a low-pass filter connected to receive a signal from the output terminal of said differential amplifier and supplying a signal for controlling said D.C. current generator in a way such that the current generated by said generator is applied as negative feed-back to the first input of said differential amplifier.

2. An amplifier circuit as claimed in claim 1 wherein the low-pass filter is of the R-C type.

3. An amplifier circuit as claimed in claim 1, wherein the active element of the input stage is a field effect transistor having two gates.

4. An automatic gain control device utilizing the amplifier circuit claimed in claim 1, characterized in that the output terminal of the differential amplifier forms an output terminal for the amplified signal, and in that this amplified signal is applied to a series of cascaded elements comprising a peak detector followed by a comparator and a further low-pass filter, and the gain control of the active element of the input stage is provided by the signal output of the said series of cascaded elements.

5. An automatic gain control device as claimed in claim 4, wherein the active element of the input stage of said amplifier circuit is a field effect transistor having first and second gates, wherein the output current of said comparator is transformed into a control voltage for the second gate of said field effect transistor by a current mirror circuit supplying a bias resistor, and wherein said further low-pass filter comprises a capacitor connected in parallel with said bias resistor.

6. An automatic gain control device comprising:

an input stage including a field effect transistor connected in series with a load resistor between first and second points of D.C. reference potential, said field effect transistor having a first gate for receiving an input signal to be amplified and a second gate for receiving a control voltage for varying the operating point of said field effect transistor and being operative in response to an input signal to produce on an active terminal of said load resistor an amplified output signal having a D.C. component which may vary in level with changes in said control voltage;

means for stabilizing the level of the D.C. component of said output signal comprising a high-gain differential amplifier having a first input connected to the active terminal of said load resistor, a second input connected to a third point of reference potential and an output terminal forming an output terminal for the amplified signal, a variable D.C. current generator having an output terminal connected to the active terminal of said load resistor, and a low pass filter connected to receive said level-controlled amplified signal from said differential amplifier for supplying a signal for controlling said D.C. current generator in a way such that the current generated by said generator is applied as negative feedback to the first input of said differential amplifier and is applied to said load resistor in opposition to the average output current of said input stage with a value such that the sum of the currents passing through said load resistor is constant; and a series of cascaded elements connected to the output terminal of said differential amplifier for receiving said level-controlled amplified signal, said series of elements comprising a peak detector followed by a comparator and a further low-pass filter and producing and applying a control voltage to the second gate of said field effect transistor.

7. An automatic gain control device as claimed in claim 6, wherein said series of cascaded elements further comprises a current mirror circuit for supplying output current from said comparator to a bias resistor connected to the second gate of said field effect transistor, and wherein said further low-pass filter comprises a capacitor connected in parallel with said bias resistor.

* * * * *